US011923188B2

(12) United States Patent
Hanashima

(10) Patent No.: US 11,923,188 B2
(45) Date of Patent: Mar. 5, 2024

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventor: Takeo Hanashima, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 654 days.

(21) Appl. No.: 17/025,388

(22) Filed: Sep. 18, 2020

(65) Prior Publication Data

US 2021/0005447 A1 Jan. 7, 2021

Related U.S. Application Data

(63) Continuation of application No. PCT/JP2018/016619, filed on Apr. 24, 2018.

(51) Int. Cl.
*H01L 21/02* (2006.01)
*C23C 16/455* (2006.01)
(Continued)

(52) U.S. Cl.
CPC ...... *H01L 21/02123* (2013.01); *C23C 16/455* (2013.01); *C23C 16/4584* (2013.01); *H01L 21/67161* (2013.01)

(58) Field of Classification Search
CPC ......... H01L 21/02123; H01L 21/67161; H01L 21/0217; H01L 21/02211; H01L 21/0228;
(Continued)

(56) References Cited

U.S. PATENT DOCUMENTS

2009/0197424 A1 8/2009 Sakai et al.
2018/0076017 A1* 3/2018 Hashimoto ....... C23C 16/45531
2018/0151347 A1 5/2018 Hanashima et al.

FOREIGN PATENT DOCUMENTS

CN 107818911 A 3/2018
CN 108122736 A 6/2018
(Continued)

OTHER PUBLICATIONS

Singapore Written Opinion dated Jun. 22, 2021 for Singapore Patent Application No. 11202009154T.
(Continued)

*Primary Examiner* — Mohammad A Rahman
(74) *Attorney, Agent, or Firm* — Volpe Koenig

(57) ABSTRACT

There is included providing a substrate in a process chamber; and forming a film on the substrate in the process chamber by supplying an inert gas from a first supplier, supplying a first processing gas from a second supplier, and supplying an inert gas from a third supplier to the substrate, the third supplier being installed at an opposite side of the first supplier with respect to a straight line that passes through the second supplier and a center of the substrate and is interposed between the first supplier and the third supplier, to the substrate, wherein in the film, a substrate in-plane film thickness distribution of the film is adjusted by controlling a balance between a flow rate of the inert gas supplied from the first supplier and a flow rate of the inert gas supplied from the third supplier.

20 Claims, 7 Drawing Sheets

(51) Int. Cl.
*C23C 16/458* (2006.01)
*H01L 21/67* (2006.01)

(58) Field of Classification Search
CPC ..... H01L 21/31; H01L 21/318; C23C 16/455; C23C 16/4584; C23C 16/345; C23C 16/45502; C23C 16/45527; C23C 16/45544; C23C 16/45578; C23C 16/45523; C23C 16/45546; C23C 16/52
See application file for complete search history.

(56) References Cited

FOREIGN PATENT DOCUMENTS

| | | |
|---|---|---|
| JP | 2010-118462 A | 5/2010 |
| JP | 2016-181545 A | 10/2016 |
| JP | 2018-046129 A | 3/2018 |

OTHER PUBLICATIONS

Korean Office Action for Korean Application No. 10-2020-7026867, dated Jun. 20, 2022. 3 pages.
Japanese Office Action dated Mar. 23, 2021 for Japanese Patent Application No. 2020-515341.
International Search Report and English Translation, PCT/JP2018/016619, dated Jul. 31, 2018, 3 pages.
Chinese Office Action dated Nov. 23, 2023 for Chinese Patent Application No. 201880091357.1.

* cited by examiner

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION(S)

This application is a Bypass Continuation Application of PCT International Application No. PCT/JP2018/016619, filed on Apr. 24, 2018, the entire contents of which are incorporated herein by reference.

TECHNICAL FIELD

The present disclosure relates to a method of manufacturing a semiconductor device, a substrate processing apparatus, and a recording medium.

BACKGROUND

As one process of manufacturing a semiconductor device, a process of forming a film on a substrate may be often carried out.

SUMMARY

The present disclosure provides some embodiments of a technique capable of controlling a substrate in-plane film thickness distribution of a film formed on a substrate.

According to one embodiment of the present disclosure, there is provided a technique that includes providing a substrate in a process chamber; and forming a film on the substrate in the process chamber by supplying an inert gas from a first supplier, supplying a first processing gas from a second supplier, and supplying an inert gas from a third supplier to the substrate, the third supplier being installed at an opposite side of the first supplier with respect to a straight line that passes through the second supplier and a center of the substrate and is interposed between the first supplier and the third supplier, wherein in the film, a substrate in-plane film thickness distribution of the film is adjusted by controlling a balance between a flow rate of the inert gas supplied from the first supplier and a flow rate of the inert gas supplied from the third supplier.

DETAILED DESCRIPTION

<One Embodiment of the Present Disclosure>

One embodiment of the present disclosure will be now described with reference to FIGS. 1 to 3 and FIGS. 4A and 4B.

(1) CONFIGURATION OF SUBSTRATE PROCESSING APPARATUS

Figure 1:
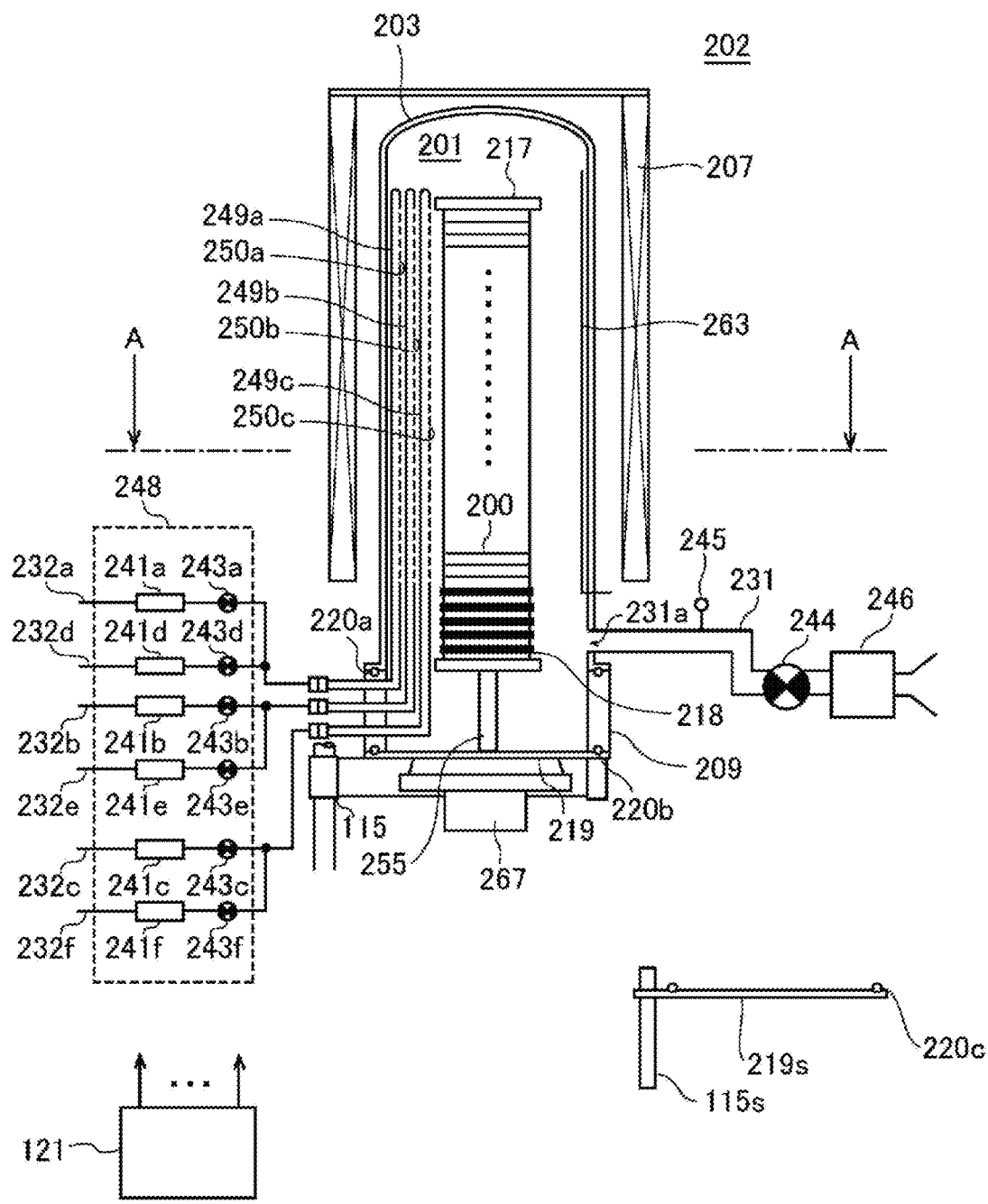
FIG. 1 is a schematic configuration view of a vertical process furnace of a substrate processing apparatus suitably used in an embodiment of the present disclosure, in which a portion of the process furnace is shown in a vertical cross section.

As illustrated in FIG. 1, a process furnace 202 includes a heater 207 as a heating mechanism (a temperature adjustment part). The heater 207 has a cylindrical shape and is supported by a support plate so as to be vertically installed. The heater 207 also functions as an activation mechanism (an excitation part) configured to thermally activate (excite) a gas.

A reaction tube 203 is disposed inside the heater 207 to be concentric with the heater 207. The reaction tube 203 is made of a heat resistant material such as, for example, quartz ($SiO_2$), silicon carbide (SiC) or the like, and has a cylindrical shape with its upper end closed and its lower end opened. A manifold 209 is disposed to be concentric with the reaction tube 203 under the reaction tube 203. The manifold 209 is made of a metal material such as, for example, stainless steel (SUS) or the like, and has a cylindrical shape with both of its upper and lower ends opened. The upper end portion of the manifold 209 engages with the lower end portion of the reaction tube 203 so as to support the reaction tube 203. An O-ring 220*a* serving as a seal member is installed between the manifold 209 and the reaction tube 203. Similar to the heater 207, the reaction tube 203 is vertically installed. A processing container (reaction container) is mainly constituted by the reaction tube 203 and the manifold 209. A process chamber 201 is formed at a hollow cylindrical portion of the processing container. The process chamber 201 is configured to accommodate a plurality of wafers 200 as substrates. Processing on the wafers 200 is performed in the process chamber 201.

Nozzles 249*a* to 249*c* as first to third suppliers are installed in the process chamber 201 so as to penetrate a sidewall of the manifold 209. Gas supply pipes 232*a* to 232*c* are connected to the nozzles 249*a* to 249*c*, respectively. The nozzles 249*a* to 249*c* are different nozzles, and each of the nozzles 249*a* and 249*c* is installed adjacent to the nozzle 249*b*.

Mass flow controllers (MFCs) 241*a* to 241*c*, which are flow rate controllers (flow rate control parts), and valves 243*a* to 243*c*, which are opening/closing valves, are installed at the gas supply pipes 232*a* to 232*c* sequentially from the upstream side of gas flow, respectively. Gas supply pipes 232*d* to 232*f* are connected to the gas supply pipes 232*a* to 232*c* at the downstream side of the valves 243*a* to 243*c*, respectively. MFCs 241*d* to 241*f* and valves 243*d* to 243f are installed in the gas supply pipes 232d to 232f sequentially from the upstream side of gas flow, respectively.

Figure 2:
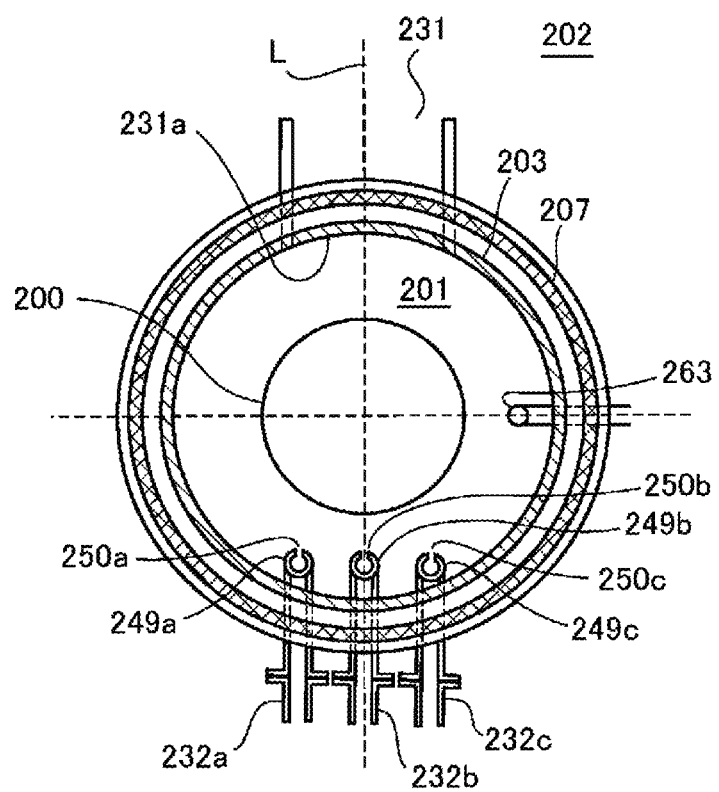
FIG. 2 is a schematic configuration view of the vertical process furnace of the substrate processing apparatus suitably used in the embodiment of the present disclosure, in which a portion of the process furnace is shown in a cross section taken along line A-A in FIG. 1.

As illustrated in FIG. 2, each of the nozzles 249a to 249c is installed at a space, which has an annular space in a plane view, between an inner wall of the reaction tube 203 and the wafers 200 so as to extend upward along an arrangement direction of the wafers 200 from a lower portion of the inner wall of the reaction tube 203 to an upper portion of the inner wall of the reaction tube 203. Specifically, each of the nozzles 249a to 249c is installed at a lateral side of a wafer arrangement region at which the wafers are arranged, namely at a region horizontally surrounding a wafer arrangement region, so as to extend along the wafer arrangement region. The nozzle 249b is disposed to face an exhaust port 231a to be described later on a straight line with the centers of the wafers 200 loaded into the process chamber 201, which are interposed between the nozzle 249b and the exhaust port 231a, in a plane view. The nozzles 249a and 249c are disposed so as to interpose a straight line L passing through the centers of the nozzle 249b and the exhaust port 231a between both sides along the inner wall of the reaction tube 203 (the outer peripheral portion of the wafers 200). The straight line L is also a straight line passing through the centers of the nozzle 249b and the wafer 200s. That is, it can be said that the nozzle 249c is installed at the opposite side to the nozzle 249a with the straight line L interposed therebetween. The nozzles 249a and 249c are disposed in line symmetry with the straight line L as a symmetry axis. Gas supply holes 250a to 250c for supplying a gas are installed at side surfaces of the nozzles 249a to 249c, respectively. Each of the gas supply holes 250a to 250c is opened to face the exhaust port 231a in a plane view to allow the gas to be supplied toward the wafers 200. The gas supply holes 250a to 250c may be installed in a plural number between a lower portion and an upper portion of the reaction tube 203.

As a first processing gas (a precursor gas), for example, a gas containing silicon (Si) as a main element (predetermined element) constituting a film to be formed on a substrate, that is, a silane-based gas is supplied from the gas supply pipe 232b into the process chamber 201 via the MFC 241b, the valve 243b, and the nozzle 249b. As the silane-based gas, for example, a halosilane-based gas containing a halogen element such as chlorine (Cl), fluorine (F), bromine (Br), iodine (I), or the like can be used. As the halosilane-based gas, for example, a chlorosilane-based gas containing Si and Cl can be used, and for example, hexachlorodisilane ($Si_2Cl_6$, abbreviation: HCDS) gas can be used.

As a second processing gas (a reaction gas) having a molecular structure different from that of the above-described first processing gas, for example, a nitrogen (N)-containing gas serving as a nitriding agent is supplied from the gas supply pipes 232a and 232c into the process chamber 201 via the MFCs 241a and 241c, the valves 243a and 243c, and the nozzles 249a and 249c, respectively. As the N-containing gas, for example, a hydrogen nitride-based gas that is a gas composed of two elements of nitrogen (N) and hydrogen (H) can be used. As the hydrogen nitride-based gas, for example, ammonia ($NH_3$) gas can be used.

An inert gas, for example, a nitrogen ($N_2$) gas, is supplied from the gas supply pipes 232d to 232f into the process chamber 201 via the MFCs 241d to 241f, the valves 243d to 243f, the gas supply pipes 232a to 232c, and the nozzles 249a to 249c, respectively. The $N_2$ gas acts as a purge gas, a carrier gas, a diluting gas, or the like, and further acts as a film thickness distribution control gas that controls the film thickness distribution in the wafer surface of a film formed on the wafer 200.

A first supply system for supplying the inert gas from the nozzle 249a mainly includes the gas supply pipe 232d, the MFC 241d, and the valve 243d. A second supply system for supplying the first processing gas from the nozzle 249b mainly includes the gas supply pipe 232b, the MFC 241b, and the valve 243b. A third supply system for supplying the inert gas from the nozzle 249c mainly includes the gas supply pipe 232f, the MFC 241f, and the valve 243f. A fourth supply system for supplying the second processing gas from at least one selected from the group of the nozzles 249a and 249c mainly includes at least one selected from the group of a set of the gas supply pipe 232a, the MFC 241a, the valve 243a and a set of the gas supply pipe 232c, the MFC 241c, and the valve 243c.

One or all of the above-described various supply systems may be configured as an integrated-type supply system 248 in which the valves 243a to 243f, the MFCs 241a to 241f and so on are integrated. The integrated-type supply system 248 is connected to each of the gas supply pipes 232a to 232f so that a supply operation of supplying various gases into the gas supply pipes 232a to 232f, that is, the opening/closing operation of the valves 243a to 243f, the flow rate adjustment, operation by the MFCs 241a to 241f, and the like are controlled by a controller 121 which will be described later. The integrated-type supply system 248 is configured as an integral type or division type integrated unit, and may be attachable/detachable to/from the gas supply pipes 232a to 232f and the like on an integrated unit basis, so that the maintenance, replacement, expansion, or the like of the integrated-type supply system 218 can be performed on an integrated unit basis.

The exhaust port 231a configured to exhaust the internal atmosphere of the process chamber 201 is installed at a lower side of the sidewall of the reaction tube 203. As illustrated in FIG. 2, the exhaust port 231a is installed at a position facing the nozzles 249a to 249c (the gas supply holes 250a to 250c) with the wafers 200 interposed therebetween in a plane view. The exhaust port 231a may be installed between a lower portion of the sidewall and an upper portion of the reaction tube 203, that is, along the wafer arrangement region. An exhaust pipe 231 is connected to the exhaust port 231a. As a vacuum exhaust device, for example, a vacuum pump 246 is connected to the exhaust pipe 231 via a pressure sensor 245 as a pressure detector (pressure detecting part) which detects the internal pressure of the process chamber 201 and an auto pressure controller (APC) valve 244 as a pressure regulator (pressure adjustment part). The APC valve 244 is configured to perform a vacuum exhaust or a vacuum exhaust stop if the interior of the process chamber 201 by opening/closing the valve while the vacuum pump 246 is actuated, and is also configured to adjust the internal pressure of the process chamber 201 by adjusting an opening degree of the valve based on pressure information detected by the pressure sensor 245 while the vacuum pump 246 is actuated. An exhaust system mainly includes the exhaust pipe 231, the APC valve 244, and the pressure sensor 245. The exhaust system may include the vacuum pump 246.

A seal cap 219, which serves as a furnace opening cover configured to hermetically seal a lower end opening of the manifold 209, is installed under the manifold 209. The seal cap 219 is made of a metal material such as, for example, stainless steel (SUS) or the like, and is formed in a disc shape. An O-ring 220b, which is a seal member making contact with the lower end portion of the manifold 209, is installed at an upper surface of the seal cap 219. A rotation mechanism 267 configured to rotate a boat 217, which will be described later, is provided under the seal cap 219. A rotary shaft 255 of the rotation mechanism 267 is connected to the boat 217 by penetrating the seal cap 219. The rotation mechanism 267 is configured to rotate the wafers 200 by rotating the boat 217. The seal cap 219 is configured to be vertically moved up and down by a boat elevator 115 which is an elevating mechanism provided outside the reaction tube 203. The boat elevator 115 is configured as a transfer device (transfer mechanism) which loads/unloads (transfers) the wafers 200 into/out of the process chamber 201 by moving the seal cap 219 up and down. A shutter 219s, which serves as a furnace opening cover configured to hermetically seal a lower end opening of the manifold 209 in a state where the seal cap 219 is lowered and the boat 217 is unloaded from the process chamber 201, is installed under the manifold 209. The shutter 219s is made of a metal material such as, for example, stainless steel (SUS) or the like, and is formed in a disc shape. An O-ring 220c, which is a seal member making contact with the lower end portion of the manifold 209, is installed at an upper surface of the shutter 219s. The opening/closing operation (such as elevation operation, rotation operation, or the like) of the shutter 219s is controlled by a shutter opening/closing mechanism 115s.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. As such, the boat 217 is configured to arrange the wafers 200 in a spaced-apart relationship. The boat 217 is made of a heat resistant material such as quartz or SiC. Heat-insulating plates 218 made of a heat resistant material such as quartz or SiC are supported below the boat 217 in multiple stages.

A temperature sensor 263 serving as a temperature detector is provided in the reaction tube 203. Based on temperature information detected by the temperature sensor 263, a state of supplying electric power to the heater 207 is adjusted such that an interior of the process chamber 201 has a desired temperature distribution. The temperature sensor 263 is installed along the inner wall of the reaction tube 203.

Figure 3:
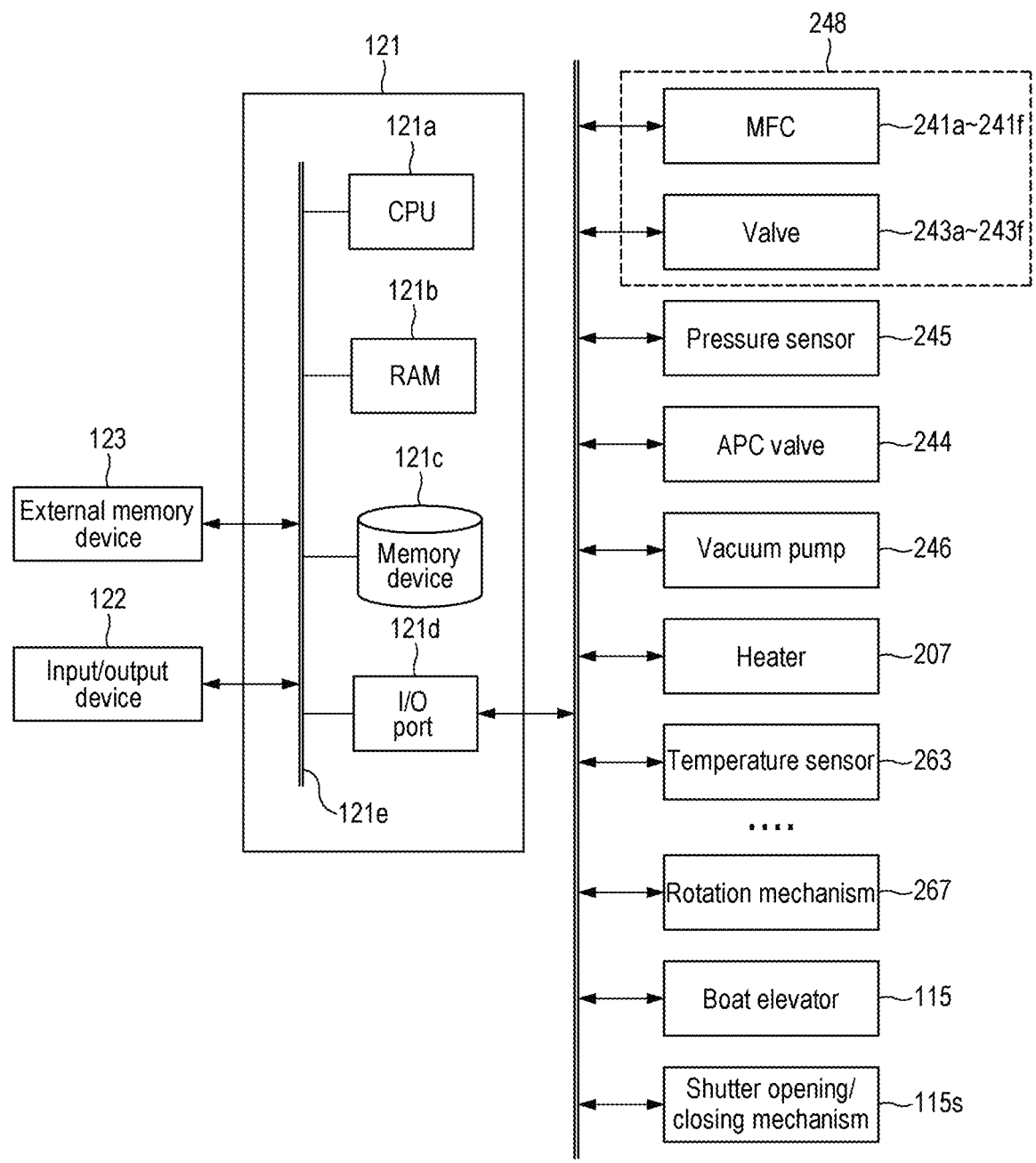
FIG. 3 is a schematic configuration diagram of a controller of the substrate processing apparatus suitably used in the embodiment of the present disclosure, in which a control system of the controller is shown in a block diagram.

As illustrated in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c, and the I/O port 121d are configured to exchange data with the CPU 121a via an internal bus 121e. An input/output device 122 formed of, for example, a touch panel or the like, is connected to the controller 121.

The memory device 121c is configured by, for example, a flash memory, a hard disk drive (HDD), or the like. A control program for controlling operations of a substrate processing apparatus, a process recipe in which sequences and conditions of substrate processing to be described later are written, and the like are readably stored in the memory device 121c. The process recipe functions as a program for causing the controller 121 to execute each sequence in the substrate processing, which will be described later, to obtain a predetermined result. Hereinafter, the process recipe and the control program may be generally and simply referred to as a "program." Furthermore, the process recipe may be simply referred to as a "recipe." When the term "program" is used herein, it may indicate a case of including the recipe only, a case of including the control program only, or a case of including both the recipe and the control program. The RAM 121b is configured as a memory area (work area) in which a program or data read by the CPU 121a is temporarily stored.

The I/O port 121d is connected to the MFCs 241a to 241f, the valves 243a to 243f, the pressure sensor 245, the APC valve 244, the vacuum pump 246, the temperature sensor 263, the heater 207, the rotation mechanism 267, the boat elevator 115, the shutter opening/closing mechanism 115s, and so on, which are described above.

The CPU 121a is configured to read and execute the control program from the memory device 121c. The CPU 121a also reads the recipe from the memory device 121c according to an input of an operation command from the input/output device 122. In addition, the CPU 121a is configured to control the flow rate adjusting operation of various kinds of gases by the MFCs 241a to 241f, the opening/closing operation of the valves 243a to 243f, the opening/closing operation of the APC valve 244, the pressure adjusting operation performed by the APC valve 244 based on the pressure sensor 245, the driving and stopping of the vacuum pump 246, the temperature-adjusting operation performed by the heater 207 based on the temperature sensor 263, the operation of rotating the boat 217 and adjusting the rotation speed of the boat by the rotation mechanism 267, the operation of moving the boat 217 up and down by the boat elevator 115, the opening/closing operation of the shutter 219s by the shutter opening/closing mechanism 115s, and so on, according to contents of the read recipe.

The controller 121 may be configured by installing, on the computer, the aforementioned program stored in an external memory device 123. Examples of the external memory device 123 may include a magnetic disk such as an HDD, an optical disc such as a CD, a magneto-optical disc such as an MO, a semiconductor memory such as a USB memory, and the like. The memory device 121c or the external memory device 123 is configured as a computer-readable recording medium. Hereinafter, the memory device 121c and/or the external memory device 123 may be generally and simply referred to as a "recording medium." When the term "recording medium" is used herein, it may indicate a case of including the memory device 121c, a case of including the external memory device 123, or a case of including both the memory device 121c and the external memory device 123. Furthermore, the program may be provided to the computer using communication means such as the Internet or a dedicated line, instead of using the external memory device 123.

(2) SUBSTRATE PROCESSING PROCESS

As one process of manufacturing a semiconductor device using the above-described substrate processing apparatus, a substrate processing sequence example of forming a film on a surface, that is, a film-forming sequence example, will be described with reference to FIGS. 4A and 4B. In the following descriptions, the operations of the respective parts constituting the substrate processing apparatus are controlled by the controller 121.

The film-forming sequence of this embodiment includes:
a step of providing a wafer 200 as a substrate in the process chamber 201; and
a step of forming a film on the wafer 200 by supplying a $N_2$ gas as an inert gas from the nozzle 249a serving as a first supplier, supplying a HCDS gas as a first processing gas from the nozzle 249b serving as a second supplier, and supplying a N₂ gas as an inert gas from the nozzle 249c serving as a third supplier to the wafer 200 in the process chamber 201, the nozzle 249c being installed at an opposite side of the nozzle 249a with respect to a straight line L that passes through the nozzle 249b and the center of the wafer 200 and is interposed between the nozzle 249a and the nozzle 249c.

In the step of forming the film described above, an in-wafer film thickness distribution of the film (hereinafter, simply referred to as an in-plane film thickness distribution) is adjusted by controlling a balance between a flow rate of the N₂ gas supplied from the nozzle 249a and a flow rate of the N₂ gas supplied from the nozzle 249c.

Figure 4A:
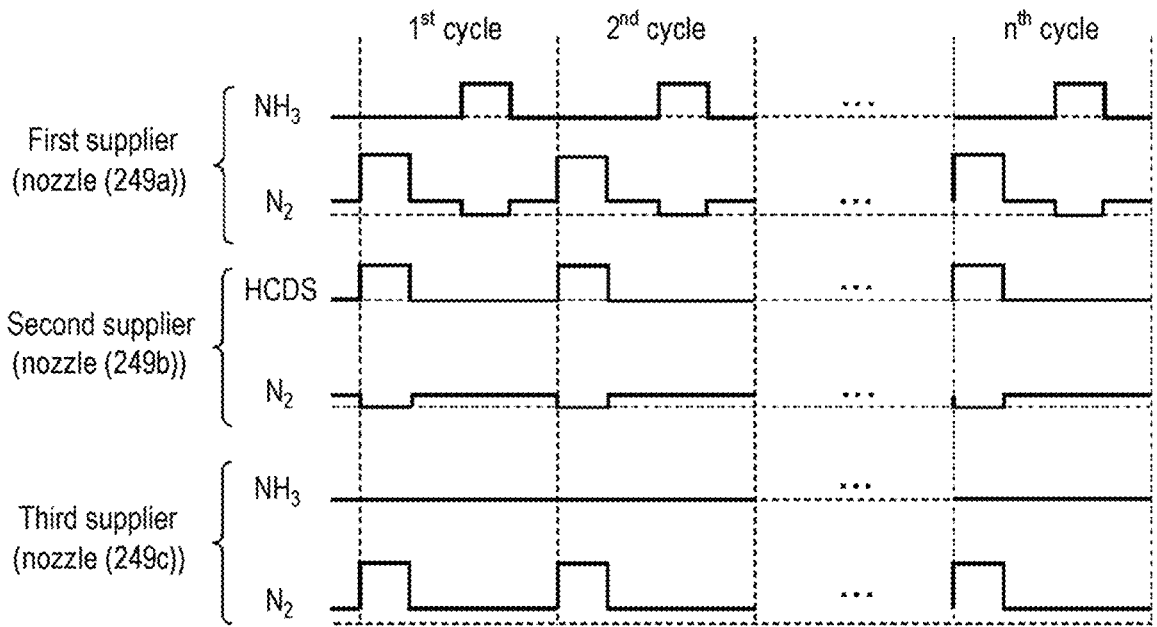
FIGS. 4A and 4B are diagrams showing a film-forming sequence of one embodiment of the present disclosure, respectively.
Figure 4B:
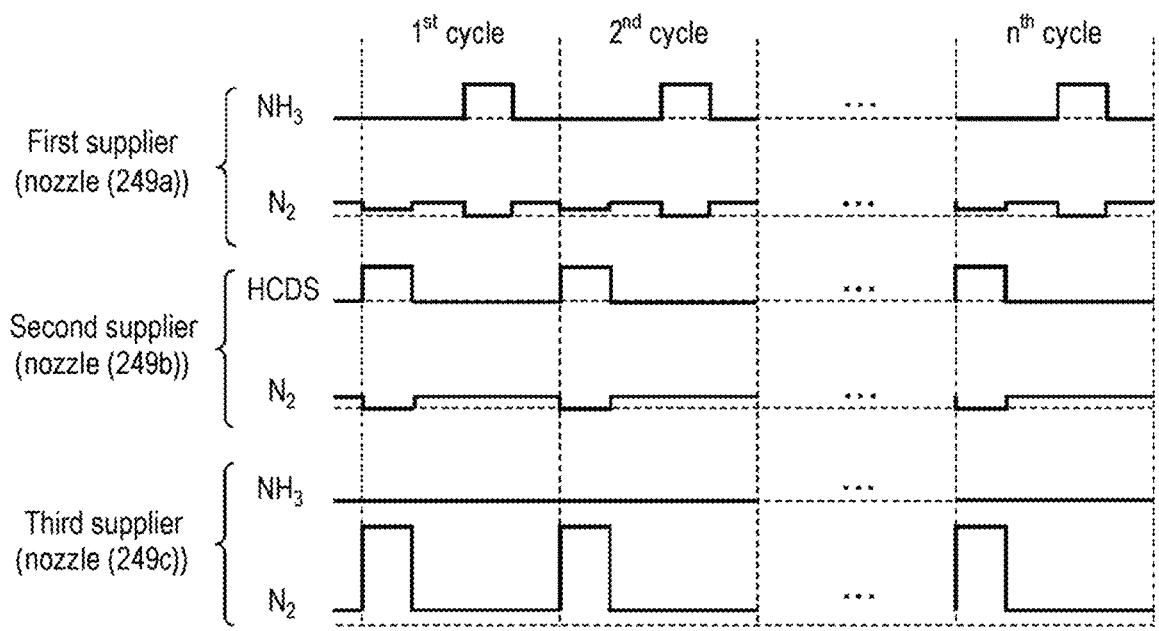

In the film-forming sequence shown in FIGS. 4A and 4B, as an example, in the step of forming the film, a film containing Si and N, that is, a silicon nitride film (a SiN film), is formed on the wafer 200 by performing a cycle a predetermined number of times (n times, n is an integer of 1 or more), the cycle non-simultaneously performing:

a step 1 of supplying the N₂ gas from the nozzle 249a, supplying the HCDS gas from the nozzle 249b, and supplying the N₂ gas from the nozzle 249c to the wafer 200 in the process chamber 201; and a step 2 of supplying an NH₃ gas as a second processing gas to the wafer 200 in the process chamber 201.

In addition, the film-forming sequence shown in FIG. 4A, which is an example of the flow rate balance control, shows that, when the HCDS gas is supplied to the wafer 200 from the nozzle 249b in the step 1, the flow rate of the N₂ gas supplied from the nozzle 249a and the flow rate of the N₂ gas supplied from the nozzle 249c are equal to each other.

In addition, the film-forming sequence shown in FIG. 4B, which is another example of the flow rate balance control, shows that, when the HCDS gas is supplied to the wafer 200 from the nozzle 249b in the step 1, the flow rate of the N₂ gas supplied from the nozzle 249a and the flow rate of the N₂ gas supplied from the nozzle 249c are different from each other.

In the following description, an example of adjusting the in-plane film thickness distribution of the SiN film by the above-described film-forming sequence and flow rate control using, as an example, a bare substrate having a small surface area with no uneven structure formed on its surface, that is, a bare wafer as the wafer 200, will be described. In the present disclosure, the in-plane film thickness distribution of a film that is the thickest in the central portion of the wafer 200 and becomes gradually thinner toward the outer peripheral portion (peripheral edge portion) of the wafer 200 is referred to as a central convex distribution. The in-plane film thickness distribution of the film that is the thinnest in the central portion of the wafer 200 and becomes gradually thicker toward the outer peripheral portion of the wafer 200 is referred to as a central concave distribution. Further, the in-plane film thickness distribution of a flat film having a small film thickness variation from the central portion of the wafer 200 to the outer peripheral portion of the wafer 200 is referred to as a flat distribution. If a film with a central convex distribution can be formed on a bare wafer, it is possible to form a film with a flat distribution on a patterned wafer (product wafer) with a large surface area in which a fine uneven structure is formed on its surface.

In the present disclosure, for the sake of convenience, the film-forming sequence shown in FIGS. 4A and 4B may sometimes be denoted as follows. The same denotation will be used in the modifications to be described later.

When the term "wafer" is used in the present disclosure, it may refer to "a wafer itself" or "a wafer and a laminated body of certain layers or films formed on a surface of the wafer." When the phrase "a surface of a wafer" is used in the present disclosure, it may refer to "a surface of a wafer itself" or "a surface of a certain layer formed on a wafer". When the expression "a certain layer is formed on a wafer" is used in the present disclosure, it may mean that "a certain layer is formed directly on a surface of a wafer itself" or that "a certain layer is formed on a layer formed on a wafer." When the term "substrate" is used in the present disclosure, it may be synonymous with the term "wafer."

(Wafer Charging and Boat Loading)

When the boat 217 is charged with a plurality of wafers 200 (wafer charging), the shutter 219s is moved by the shutter opening/closing mechanism 115s and the lower end opening of the manifold 209 is opened (shutter open). Thereafter, as illustrated in FIG. 1, the boat 217 charged with the wafers 200 is lifted up by the boat elevator 115 to be loaded into the process chamber 201 (boat loading). In this state, the seal cap 219 seals the lower end of the manifold 209 through the O-ring 220b.

By these operations, the wafers 200 are provided in the process chamber 201.

(Pressure Adjustment and Temperature Adjustment)

After the wafers 200 are provided in the process chamber 201, the interior of the process chamber 201, that is, a space where the wafers 200 are placed, is vacuum-exhausted (decompression-exhausted) by the vacuum pump 246 to reach a desired pressure (vacuum degree). At this time, the internal pressure of the process chamber 201 is measured by the pressure sensor 245, and the APC valve 244 is feedback-controlled based on the measured pressure information. Further, the wafers 200 in the process chamber 201 are heated by the heater 207 so as to have a desired film-forming temperature. At this time, the state of supplying electric power to the heater 207 is feedback-controlled based on the temperature information detected by the temperature sensor 263 so that the interior of the process chamber 201 has a desired temperature distribution. Further, the rotation of the wafers 200 by the rotation mechanism 267 is started. The exhaust of the interior of the process chamber 201 and the heating and rotation of the wafers 200 are continuously performed at least until the processing on the wafers 200 is completed.

(Film-Forming Step)

Thereafter, the following steps 1 and 2 are sequentially performed.

[Step 1]

In this step, a N₂ gas is supplied from the nozzle 249a, a HCDS gas is supplied from the nozzle 249b, and a N₂ is supplied from the nozzle 249c to the wafer 200 in the process chamber 201.

Specifically, the valve 243b is opened to allow the HCDS gas to flow into the gas supply pipe 232b. The flow rate of the HCDS gas is adjusted by the MFC 241b, and the HCDS gas is supplied into the process chamber 201 via the nozzle 249b and is exhausted via the exhaust port 231a. In this operation, the HCDS gas is supplied to the wafer 200. In addition, at this time, the valve 243d and 243f are opened to allow the N₂ gas to flow into the gas supply pipes 232d and 232f, respectively. The flow rate of the N₂ gas is adjusted by the MFCs 241d and 241f, and the N₂ gas is supplied into the process chamber 201 via the gas supply pipes 232a and 232c, and the nozzles 249a and 249c, respectively, and is exhausted via the exhaust port 231a. In this operation, the $N_2$ gas is supplied to the wafer 200. The $N_2$ gas is mixed with the HCDS gas in the process chamber 201. At this time, the valve 243e may be opened to allow a $N_2$ gas to flow into the gas supply pipe 232e. The flow rate of the $N_2$ gas is adjusted by the MFC 241e, and the $N_2$ gas is mixed with the HCDS gas in the nozzle 249b in the gas supply pipe 232b, is supplied into the process chamber 201 and is exhausted via the exhaust port 231a.

By supplying the HCDS gas to the wafer 200, a Si-containing layer containing Cl as a first layer is formed on the surface of the wafer 200. The Si-containing layer containing Cl is formed by physical adsorption of HCDS on the surface of the wafer 200, chemical adsorption of a substance obtained by partially decomposing HCDS, deposition of Si by pyrolysis of HCDS, etc. That is, the Si-containing layer containing Cl may be an adsorption layer (physical adsorption layer or chemical adsorption layer) of HCDS or a substance obtained by partially decomposing HCDS, or may be a deposition layer of Si containing Si (Si layer). Hereinafter, the Si-containing layer containing Cl is also simply referred to as a Si-containing layer.

In this step, when the HCDS gas is supplied from the nozzle 249b to the wafer 200, the $N_2$ gas is supplied into the process chamber 201 via each of the nozzles 249a and 249c. At this time, a balance between the flow rate of the $N_2$ gas supplied from the nozzle 249a and the flow rate of the $N_2$ gas supplied from the nozzle 249c is controlled. As a result, as described below, it becomes possible to freely adjust a wafer in-plane thickness distribution (hereinafter also simply referred to as an in-plane thickness distribution) of the first layer formed on the wafer 200.

For example, as shown in FIG. 4A, when the HCDS gas is supplied to the wafer 200 from the nozzle 249b, the flow rate of the $N_2$ gas supplied from the nozzle 249a and the flow rate of the $N_2$ gas supplied from the nozzle 249c are set to be equal to each other. By controlling the flow rate balance of the $N_2$ gas at the time of supplying the HCDS gas in this manner, it can be controlled in a direction where the concentration, that is, the partial pressure (supply amount) of the HCDS gas supplied to the central portion of the wafer 200 becomes high (increased) and in a direction where the concentration, that is, the partial pressure (supply amount) of the HCDS gas supplied to the outer peripheral portion of the wafer 200 becomes low (decreased). As a result, it is possible to make the in-plane thickness distribution of the first layer formed on the wafer 200, which is configured as a bare wafer, a central convex distribution.

In addition, when the flow rate of the $N_2$ gas supplied from the nozzle 249a and the flow rate of the $N_2$ gas supplied from the nozzle 249c are set to be equal to each other, as shown in FIG. 4A, the respective flow rates may be set to be higher than the flow rate of the HCDS gas supplied from the nozzle 249b. By controlling the flow rate balance of the $N_2$ gas at the time of supplying the HCDS gas in this manner, it is possible to reliably make the in-plane thickness distribution of the first layer formed on the wafer 200, which is configured as a bare wafer, a central convex distribution.

In addition, for example, as shown in FIG. 4B, when the HCDS gas is supplied to the wafer 200 from the nozzle 249b, the flow rate of the $N_2$ gas supplied from the nozzle 249a and the flow rate of the $N_2$ gas supplied from the nozzle 249c are set to be different from each other. That is, one of the flow rate of the $N_2$ gas supplied from the nozzle 249a and the flow rate of the $N_2$ gas supplied from the nozzle 249c is set to be higher than the other flow rate. FIG. 4B shows an example in which the flow rate of the $N_2$ gas supplied from the nozzle 249c is set to be higher than the flow rate of the $N_2$ gas supplied from the nozzle 249a. By controlling the flow rate balance of the $N_2$ gas when supplying the HCDS gas in this manner, it can be controlled in a direction where the concentration, that is, the partial pressure (supply amount) of the HCDS gas supplied to the central portion of the wafer 200 becomes low (decreased), and in a direction where the concentration, that is, the partial pressure (supply amount) of the HCDS gas supplied to the outer peripheral portion of the wafer 200 becomes high (increased). As a result, it is possible to make the in-plane thickness distribution of the first layer formed on the wafer 200, which is configured as a bare wafer, such that it becomes close to the flat distribution or close even to the central concave distribution from the central convex distribution.

In addition, when the flow rate of the $N_2$ gas supplied from the nozzle 249c is made higher than the flow rate of the $N_2$ gas supplied from the nozzle 249a, the flow rate of the $N_2$ gas supplied from the nozzle 249c may be set to be higher than the flow rate of the HCDS gas supplied from the nozzle 249b. By controlling the flow rate balance of the $N_2$ gas when supplying the HCDS gas in this manner, it is possible to reliably make the in-plane thickness distribution of the first layer formed on the wafer 200, which is configured as a bare wafer, such that it becomes close to the flat distribution or close even to the central concave distribution from the central convex distribution.

In addition, when the flow rate of the $N_2$ gas supplied from the nozzle 249c is made higher than the flow rate of the $N_2$ gas supplied from the nozzle 249a, the flow rate of the $N_2$ gas supplied from the nozzle 249a may be set to be lower than the flow rate of the HCDS gas supplied from the nozzle 249b. By controlling the flow rate balance of the $N_2$ gas when supplying the HCDS gas in this manner, it is possible to reliably make the in-plane thickness distribution of the first layer formed on the wafer 200, which is configured as a bare wafer, such that it becomes close to the flat distribution or close even to the central concave distribution from the central convex distribution.

In addition, when the flow rate of the $N_2$ gas supplied from the nozzle 249c is made higher than the flow rate of the $N_2$ gas supplied from the nozzle 249a, as shown in FIG. 4B, the $N_2$ gas supplied from the nozzle 249c may be set to be higher than the flow rate of the HCDS gas supplied from the nozzle 249b, and the flow rate of the $N_2$ gas supplied from the nozzle 249a may be set to be lower than the flow rate of the HCDS gas supplied from the nozzle 249b. By controlling the flow rate balance of the $N_2$ gas at the time of supplying the HCDS gas in this manner, it is possible to more reliably make the in-plane thickness distribution of the first layer formed on the wafer 200, which is configured as a bare wafer, such that it becomes close to the flat distribution or close even to the central concave distribution from the central convex distribution.

In addition, when the flow rate of the $N_2$ gas supplied from the nozzle 249c is made higher than the flow rate of the $N_2$ gas supplied from the nozzle 249a, the flow rate of the $N_2$ gas supplied from the nozzle 249a may be set to zero. That is, the $N_2$ gas may not be supplied from the nozzle 249a. By controlling the flow rate balance of the $N_2$ gas when supplying the HCDS gas in this manner, it is possible to reliably make the in-plane thickness distribution of the first layer formed on the wafer 200, which is configured as a bare wafer, such that it becomes close to the flat distribution or close even to the central concave distribution from the central convex distribution.

Further, when the flow rate of the $N_2$ gas supplied from the nozzle 249c is made higher than the flow rate of the $N_2$ gas supplied from the nozzle 249a, the flow rate of the $N_2$ gas supplied from the nozzle 249c may be set to be higher than the flow rate of the HCDS gas supplied from the nozzle 249b, and the flow rate of the $N_2$ gas supplied from the nozzle 249a may be set to zero. By controlling the flow rate balance of the $N_2$ gas when supplying the HCDS gas in this manner, it is possible to more reliably make the in-plane thickness distribution of the first layer formed on the wafer 200, which is configured as a bare wafer, such that it becomes close to the flat distribution or close even to the central concave distribution from the central convex distribution.

After the first layer having a desired in-plane thickness distribution is formed on the wafer 200, the valve 243b is closed and the supply of HCDS gas into the process chamber 201 is stopped. Then, the interior of the process chamber 201 is vacuum-exhausted to remove a gas and the like remaining in the process chamber 201 from the interior of the process chamber 201. At this time, the valves 243d to 243f are opened to supply a $N_2$ gas into the process chamber 201 via the nozzles 249a to 249c. The $N_2$ gas supplied from the nozzles 249a to 249c acts as a purge gas, whereby the interior of the process chamber 201 is purged (purge step).

[Step 2]

After the step 1 is completed, an $NH_3$ gas is supplied to the wafer 200 in the process chamber 201, that is, the first layer formed on the wafer 200.

Specifically, the valve 243a is opened to allow the $NH_3$ gas to flow into the gas supply pipe 232a. The flow rate of the $NH_3$ gas is adjusted by the MFC 241a, and the $NH_3$ gas is supplied into the process chamber 201 via the nozzle 249a and is exhausted via the exhaust port 231a. In this operation, the $NH_3$ gas is supplied to the wafer 200. At this time, the valves 243e and 243f are opened, and a $N_2$ gas is supplied into the process chamber 201 via the nozzles 249b and 249c. The supply of the $N_2$ gas from the nozzles 249b and 249c may not be performed.

By supplying the $NH_3$ gas to the wafer 200, at least a portion of the first layer formed on the wafer 200 is nitrided (modified). As the first layer is modified, a second layer containing Si and N, that is, a SiN layer, is formed on the wafer 200. When the second layer is formed, impurities such as Cl or the like contained in the first layer constitute a gaseous substance containing at least Cl in the process of modifying the first layer by the $NH_3$ gas and are discharged from the interior of the process chamber 201. As a result, the second layer becomes a layer having fewer impurities such as Cl than those of the first layer.

After the second layer is formed on the wafer 200, the valve 243a is closed and the supply of $NH_3$ gas into the process chamber 201 is stopped. Then, gases and the like remaining in the process chamber 201 are removed from the interior of the process chamber 201 by the same processing procedure and process conditions as the purge step of the step 1.

(Performing Predetermined Number of Times)

When a cycle that non-simultaneously (i.e., asynchronously) performs the above-described steps 1 and 2 is performed once or more (n times), a SiN film having a predetermined composition and predetermined film thickness can be formed on the wafer 200. This cycle may be repeated multiple times. That is, the thickness of the second layer formed per one cycle may be set to be smaller than a desired film thickness. Thus, the above cycle may be repeated multiple times until the film thickness of a SiN film formed by stacking the second layers becomes equal to the desired film thickness.

According to this embodiment, the in-plane thickness distribution of the SiN film formed on the wafer 200 can be freely adjusted by adjusting the in-plane thickness distribution of the first layer formed in the step 1. For example, by setting the in-plane thickness distribution of the first layer to be formed in the step 1 to be the central convex distribution, it possible to make the in-plane film thickness distribution of the SiN film formed on the wafer 200 the central convex distribution. Further, for example, by setting the in-plane thickness distribution of the first layer to be formed in the step 1 to the flat distribution or the central concave distribution, it possible to make the in-plane film thickness distribution of the SiN film formed on the wafer 200 the flat distribution or the central concave distribution.

An example of the process conditions in the step 1 is described as follows.

HCDS gas supply flow rate: 100 to 2,000 sccm $N_2$ gas supply flow rate (gas supply pipe 232a): 0 to 10,000 sccm $N_2$ gas supply flow rate (gas supply pipe 232c): 0 to 10,000 sccm Gas supply time: 1 to 120 seconds, specifically 1 to 60 seconds Processing temperature: 250 to 700 degrees C., specifically 300 to 650 degrees more specifically 350 to 600 degrees C.

Processing pressure: 1 to 2,666 Pa, specifically 67 to 1,333 Pa

In the present disclosure, the notation of a numerical range such as "250 to 700 degrees C." means that the lower limit value and the upper limit value are included in the range. For example, "250 to 700 degrees C." means "equal to or higher than 250 degrees C. and equal to or smaller than 700 degrees C." The same applies to other numerical ranges.

An example of the process conditions in the step 2 is described as follows.

$NH_3$ gas supply flow rate: 100 to 10,000 sccm $N_2$ gas supply flow rate (for each gas supply pipe): 0 to 10,000 sccm Other process conditions are the same as the process conditions in the step 1.

As the first processing gas, in addition to the HCDS gas, it may be possible to use a chlorosilane-based gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, an octachlorotrisilane ($Si_3Cl_8$, abbreviation: OCTS) gas, or the like. Further, instead of these gases, it may be possible to use a tetrafluorosilane ($SiF_4$) gas, a tetrabromosilane ($SiBr_4$) gas, a tetraiodosilane ($SiI_4$) gas, or the like. That is, instead of the chlorosilane-based gas, it may be possible to use a halosilane-based gas such as a fluorosilane-based gas, a bromosilane-based gas, an iodosilane-based gas, or the like.

As the second processing gas, in addition to the $NH_3$ gas, it may be possible to use, for example, a hydrogen nitride-based gas such as a diazene ($N_2H_2$) gas, a hydrazine ($N_2H_4$) gas, a $N_3H_8$ gas, or the like.

As the inert gas, in addition to the $N_2$ gas, it may be possible to use a rare gas such as an Ar gas, a He gas, a Ne gas, a Xe gas, or the like.

(After-Purge and Atmospheric Pressure Return)

After the film-forming step is completed, a $N_2$ gas as a purge gas is supplied into the process chamber 201 from each of the nozzles 249a to 249c and is exhausted via the exhaust port 231a. Thus, the interior of the process chamber 201 is purged and the residual gas and the reaction byproducts remaining in the process chamber 201 are removed from the interior of the process chamber 201 (after-purge). Thereafter, the internal atmosphere of the process chamber 201 is substituted with an inert gas (inert gas substitution) and the internal pressure of the process chamber 201 is returned to the atmospheric pressure (atmospheric pressure return).

(Boat Unloading and Wafer Discharging)

The seal cap 219 is moved down by the boat elevator 115 to open the lower end of the manifold 209. Then, the processed wafers 200 supported by the boat 217 are unloaded from the lower end of the manifold 209 to the outside of the reaction tube 203 (boat unloading). After the boat unloading, the shutter 219s is moved, and the lower end opening of the manifold 209 is sealed by the shutter 219s through the O-ring 220c (shutter closing). The processed wafers 200 are unloaded from the reaction tube 203 and then discharged from the boat 217 (wafer discharging).

(3) EFFECTS OF THE PRESENT EMBODIMENT

According to the present embodiment, one or more effects set forth below may be achieved.

(a) When the HCDS gas is supplied from the nozzle 249b in the step 1, a condition, in which when the SiN film is formed on the wafer 200 configured as a bare wafer, the in-plane film thickness distribution of this film becomes the central convex distribution, can be established by making the flow rate of the $N_2$ gas supplied from the nozzle 249a and the flow rate of the $N_2$ gas supplied from the nozzle 249c equal to each other.

When the flow rate of the $N_2$ gas supplied from the nozzle 249a and the flow rate of the $N_2$ gas supplied from the nozzle 249c are set to be equal to each other, a condition, in which the in-plane film thickness distribution of this film becomes the central convex distribution, can be reliably established by making each flow rate higher than the flow rate of the HCDS gas supplied from the nozzle 249b.

(b) When the HCDS gas is supplied from the nozzle 249b in the step 1, a condition, in which when the SiN film is formed on the wafer 200 configured as a bare wafer, the in-plane film thickness distribution of this film becomes any distribution between the central convex distribution and the central concave distribution, can be established by making the flow rate of the $N_2$ gas supplied from the nozzle 249a and the flow rate of the $N_2$ gas supplied from the nozzle 249c different from each other, for example, by making the flow rate of the $N_2$ gas supplied from the nozzle 249c higher than the flow rate of the $N_2$ gas supplied from the nozzle 249a.

In addition, when the flow rate of the $N_2$ gas supplied from the nozzle 249a and the flow rate of the $N_2$ gas supplied from the nozzle 249c are set to be different from each other, a condition, in which the in-plane film thickness distribution of the SiN film becomes any distribution between the central convex distribution and the central concave distribution, can be reliably established by making the flow rate of the $N_2$ gas supplied from the nozzle 249c higher than the flow rate of the $N_2$ gas supplied from the nozzle 249a and by making the flow rate of the $N_2$ gas supplied from the nozzle 249c higher than the flow rate of the HCDS gas supplied from the nozzle 249b.

In addition, when the flow rate of the $N_2$ gas supplied from the nozzle 249a and the flow rate of the $N_2$ gas supplied from the nozzle 249c are set to be different from each other, a condition, in which the in-plane film thickness distribution of the SiN film becomes any distribution between the central convex distribution and the central concave distribution, can be reliably established by making the flow rate of the $N_2$ gas supplied from the nozzle 249c higher than the flow rate of the N2 gas supplied from the nozzle 249a and by making the flow rate of the $N_2$ gas supplied from the nozzle 249a lower than the flow rate of the HCDS gas supplied from the nozzle 249b.

In addition, when the flow rate of the $N_2$ gas supplied from the nozzle 249a and the flow rate of the $N_2$ gas supplied from the nozzle 249c are set to be different from each other, a condition, in which the in-plane film thickness distribution of the SiN film becomes any distribution between the central convex distribution and the central concave distribution, can be more reliably established by making the flow rate of the $N_2$ gas supplied from the nozzle 249c higher than the flow rate of the $N_2$ gas supplied from the nozzle 249a, by making the flow rate of the $N_2$ gas supplied from the nozzle 249c higher than the flow rate of the HCDS gas supplied from the nozzle 249b, and by making the flow rate of the $N_2$ gas supplied from the nozzle 249a lower than the flow rate of the HCDS gas supplied from the nozzle 249b.

In addition, when the flow rate of the $N_2$ gas supplied from the nozzle 249a and the flow rate of the $N_2$ gas supplied from the nozzle 249c are set to be different from each other, a condition, in which the in-plane film thickness distribution of the SiN film becomes any distribution between the central convex distribution and the central concave distribution, can be reliably established by making the flow rate of the $N_2$ gas supplied from the nozzle 249c higher than the flow rate of the $N_2$ gas supplied from the nozzle 249a and by setting the flow rate of the $N_2$ gas supplied from the nozzle 249a to zero.

Further, when the flow rate of the $N_2$ gas supplied from the nozzle 249a and the flow rate of the $N_2$ gas supplied from the nozzle 249c are set to be different from each other, a condition, in which the in-plane film thickness distribution of the SiN film becomes any distribution between the central convex distribution and the central concave distribution, can be reliably established by making the flow rate of the $N_2$ gas supplied from the nozzle 249c higher than the flow rate of the $N_2$ gas supplied from the nozzle 249a, by making the flow rate of the $N_2$ gas supplied from the nozzle 249c higher than the flow rate of the HCDS gas supplied from the nozzle 249b, and by setting the flow rate of the $N_2$ gas supplied from the nozzle 249a to zero.

(c) As described above, according to the present embodiment, when the HCDS gas is supplied from the nozzle 249b in the step 1, by controlling the balance between the flow rate of the $N_2$ gas supplied from the nozzle 249a and the flow rate of the $N_2$ gas supplied from the nozzle 249c, it is possible to freely adjust the in-plane film thickness distribution of the SiN film formed on the wafer 200. If it is capable of forming a film having a central convex distribution on a bare wafer, it is possible to form a film having a flat distribution on a patterned wafer having a large surface area in which a fine uneven structure is formed on its surface.

Further, the in-plane film thickness distribution of the film formed on the wafer 200 depends on the surface area of the wafer 200, which may be considered by a so-called loading effect. When the HCDS gas is allowed to flow from the outer peripheral portion side of the wafer 200 toward the central portion side thereof as in the substrate processing apparatus in the present embodiment, as the surface area of the wafer 200 on which a film will be formed becomes larger, the HCDS gas in the outer peripheral portion of the wafer 200 is more consumed, which makes the HCDS difficult to reach the central portion thereof. As a result, the in-plane film thickness distribution of the film formed on the wafer 200 becomes the central concave distribution. According to the present embodiment, even when a patterned wafer having a large surface area is used as the wafer 200, it can be freely controlled such that the in-plane film thickness distribution of the film formed on the wafer 200 is reformed from the central concave distribution to the flat distribution or even to the central convex distribution.

(d) By arranging at least the nozzle 249b, desirably the nozzles 249a to 249c, respectively so as to face the exhaust port 231a when viewed at least in a plane view, it is possible to improve the controllability of the in-plane film thickness distribution of the SiN film formed on the wafer 200. Further, by arranging the nozzles 249a and 249c in line symmetry with the straight line L as the axis of symmetry, it is possible to further improve the controllability of the in-plane film thickness distribution of the SiN film formed on the wafer 200.

(e) The above-described effects can be obtained similarly even when the first processing gas other than the HCDS gas is used, when the second processing gas other than the $NH_3$ gas is used, and when the inert gas other than the $N_2$ gas is used.

(4) MODIFICATIONS

The film-forming step in the present embodiment is not limited to the mode shown in FIGS. 4A and 4B, and can be changed as in modifications described below. These modifications can be arbitrarily combined. Unless otherwise specified, the processing procedure and process conditions in each step of each modification can be the same as the processing procedure and process conditions in each step of the substrate processing sequence described above.

Modification 1

In the step 1, when the flow rate of the $N_2$ gas supplied from the nozzle 249a and the flow rate of the $N_2$ gas supplied from the nozzle 249c are set to be different from each other, the flow rate of the $N_2$ gas supplied from the nozzle 249a may be made higher than the flow rate of the $N_2$ gas supplied from the nozzle 249c. Even in this modification, as in the film-forming sequence shown in FIG. 4B, it is possible to make the in-plane film thickness distribution of the SiN film formed on the wafer 200, which is configured as a bare wafer, any distribution between the central convex distribution and the central concave distribution.

Modification 2

In the step 2, the $N_2$ gas may be supplied from the nozzle 249a, the $NH_3$ gas may be supplied from the nozzle 249b, and the $N_2$ gas may be supplied from the nozzle 249c to the wafer 200 in the process chamber 201. Then, when the $NH_3$ gas is supplied from the nozzle 249b to the wafer 200, the balance between the flow rate of the $N_2$ gas supplied from the nozzle 249a and the flow rate of the $N_2$ gas supplied from the nozzle 249c may be controlled. Accordingly, it is possible to control the wafer in-plane composition distribution of the second layer formed on the wafer 200 by performing the step 2, that is, the wafer in-plane composition distribution of the SiN film formed on the wafer 200 by performing the film-forming step.

Modification 3

As the first processing gas, in addition to the halosilane-based gas, it may be possible to use a silicon hydride gas such as a monosilane ($SiH_4$, abbreviation: MS) gas, a disilane ($Si_2H_6$, abbreviation: DS) gas, or the like, or an aminosilane-based gas such as a trisdimethylaminosilane ($Si[N(CH_3)_2]_3H$, abbreviation: 3DMAS) gas, a bisdiethylaminosilane ($Si[N(C_2H_5)_2]_2H_2$, abbreviation: BDEAS) gas, or the like.

Further, as the second processing gas, it may be possible to use, for exmaple, an amine-based gas such as a triethylamine (($(C_2H_5)_3N$, abbreviation: TEA) gas, or the like, an oxygen (O)-containing gas (oxidant) such as an oxygen ($O_2$) gas, water vapor ($H_2O$ gas), an ozone ($O_3$) gas, a plasma-excited $O_2$ gas ($O_2^*$), an $O_2$ gas+hydrogen ($H_2$) gas, or the like, a carbon (C)-containing gas such as a propylene ($C_3H_6$) gas or the like, or a boron (B)-containing gas such as a trichloroborane ($BCl_3$) gas or the like.

Then, for example, a silicon oxynitride film (SiON film), a silicon oxycarbide film (SiOC film), a silicon carbonitride film (SiCN film), a silicon oxycarbonitride film (SiOCN), a silicon borocarbonitride film (SiBCN film), a silicon boronitride film (SiBN film), a silicon oxide film (SiO film), a silicon film (Si film), or the like may be formed on the wafer 200 by the following film formation sequences. In the following film-forming sequences, when supplying the first processing gas (HCDS gas, 3DMAS gas, BDEAS gas, DCS gas, MS gas, etc.) from the nozzle 249b, or when supplying the second processing gas ($NH_3$ gas, $O_2$ gas, TEA gas, $C_3H_6$ gas, $BCl_3$ gas, etc.) from the nozzle 249b, the flow rate balance of the $N_2$ gas supplied from the nozzles 249a and 249c is controlled in the same manner as the film-forming sequence shown in FIGS. 4A and 4B and the above-described modifications. Accordingly, the same effects as those of the film-forming sequence shown in FIGS. 4A and 4B and the above-described modifications can be obtained.

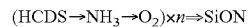

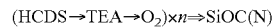

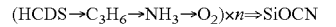

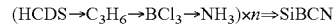

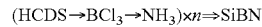

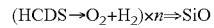

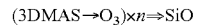

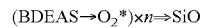

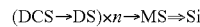

<Other Embodiments of the Present Disclosure>

The embodiment of the present disclosure has been described in detail above. However, the present disclosure is not limited to the aforementioned embodiment, but may be differently modified without departing from the subject matter of the present disclosure.

In the above-described embodiment, an example in which the nozzles 249a to 249c are installed adjacent (close) to each other has been described, but the present disclosure is not limited to such an aspect. For example, the nozzles 249a and 249c may be installed at positions apart from the nozzle 249b in the annular space when viewed in a plane view between the inner wall of the reaction tube 203 and the wafer 200.

In the above-described embodiment, an example in which the first to third suppliers are composed of the nozzles 249a to 249c and three nozzles are installed in the process chamber 201 has been described, but the present disclosure is not limited to such an aspect. For example, at least one of the first to third suppliers may be composed of two or more nozzles. Further, a nozzle other than the first to third suppliers may be newly installed in the process chamber 201, and a $N_2$ gas or various processing gases may be further supplied using this nozzle. When the nozzle other than the nozzles 249a to 249c are installed in the process chamber 201, the newly installed nozzle may be installed at a position facing the exhaust port 231a in a plane view or may be installed at a position not facing the exhaust port 231a. That is, the newly installed nozzle may be installed at a position distant from the nozzles 249a to 249c, for example, at an intermediate position between the nozzles 249a to 249c and the exhaust port 231a or at a position near the intermediate position along the outer periphery of the wafer 200 in the annular space in a plane view between the inner wall of the reaction tube 203 and the wafer 200.

In the above embodiment, an example of forming a film containing Si as a main element on the substrate has been described, but the present disclosure is not limited to such an aspect. Specifically, the present disclosure can be suitably applied to even a case where a film containing a semimetal element such as germanium (Ge), B, or the like as a main element in addition to Si is formed on the substrate. Further, the present disclosure can be suitably applied to even a case where a film containing a metal element such as titanium (Ti), zirconium (Zr), hafnium (Hf), niobium (Nb), tantalum (Ta), molybdenum (Mo), tungsten (W), yttrium (Y), lanthanum (La), strontium (Sr), aluminum (Al), or the like as a main element is formed on the substrate.

For example, the present disclosure can be suitably applied to even a case of forming a titanium nitride film (TiN film), a titanium oxynitride film (TiON film), a titanium aluminum carbonitride film (TiAlCN film), a titanium aluminum carbide film (TiAlC film), a titanium carbonitride film (TiCN film), a titanium oxide film (TiO), or the like on the substrate by the following film-forming sequences using a titanium tetrachloride ($TiCl_4$) gas or a trimethylaluminum ($Al(CH_3)_3$, abbreviation: TMA) gas as the first and second processing gases.

$(TiCl_4 \rightarrow NH_3) \times n \Rightarrow TiN$

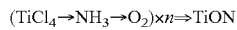

$(TiCl_4 \rightarrow NH_3 \rightarrow O_2) \times n \Rightarrow TiON$

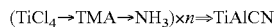

$(TiCl_4 \rightarrow TMA \rightarrow NH_3) \times n \Rightarrow TiAlCN$

$(TiCl_4 \rightarrow TMA) \times n \Rightarrow TiAlC$

$(TiCl_4 \rightarrow TEA) \times n \Rightarrow TiCN$

$(TiCl_4 \rightarrow H_2O) \times n \Rightarrow TiO$

Recipes used in the substrate processing may be prepared individually according to the processing contents and may be stored in the memory device 121c via a telecommunication line or the external memory device 123. Moreover, at the beginning of each process, the CPU 121a may properly select an appropriate recipe from the recipes stored in the memory device 121c according to the processing contents. Thus, it is possible for a single substrate processing apparatus to form films of various kinds, composition ratios, qualities, and thicknesses with enhanced reproducibility. Further, it is possible to reduce an operator's burden and to quickly start the substrate processing while avoiding an operation error.

The recipes mentioned above are not limited to newly-prepared ones but may be prepared, for example, by modifying existing recipes that are already installed in the substrate processing apparatus. Once the recipes are modified, the modified recipes may be installed in the substrate processing apparatus via a telecommunication line or a recording medium storing the recipes. In addition, the existing recipes already installed in the substrate processing apparatus may be directly modified by operating the input/output device 122 of the substrate processing apparatus.

Figure 5A:
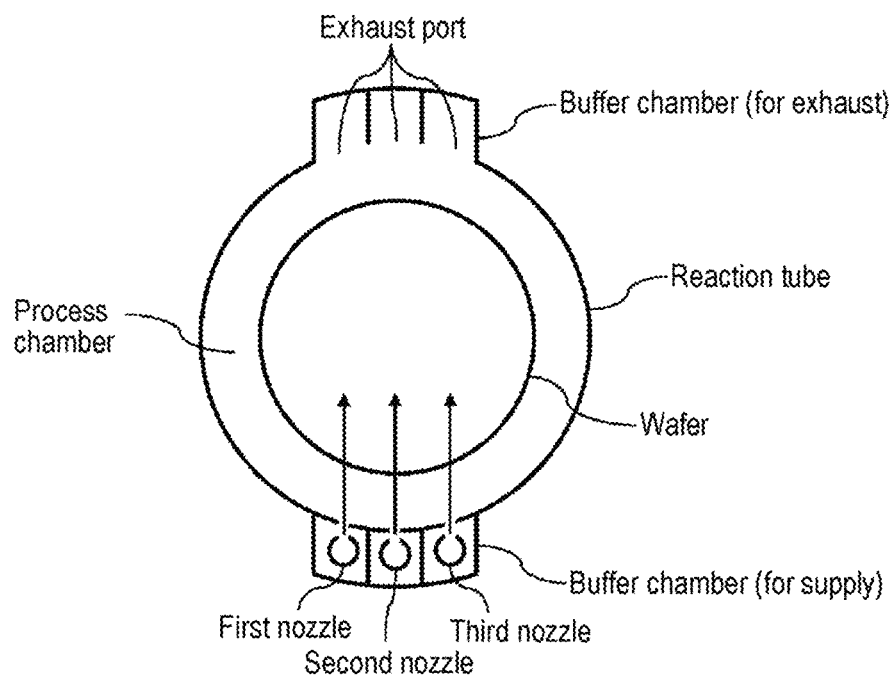
FIGS. 5A and 5B are horizontal cross-sectional views showing a modification of the vertical process furnace, in which a reaction tube, a buffer chamber, a nozzle, and the like are partially extracted.
Figure 5B:
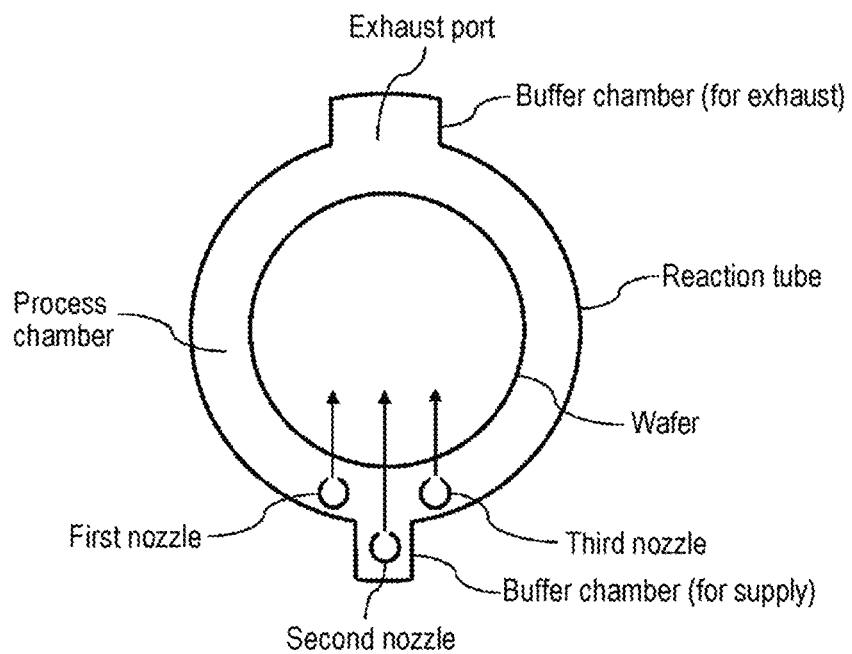

In the above-described embodiment, an example has been described in which the first to third nozzles (the nozzles 249a to 249c) as the first to third suppliers are installed in the process chamber along the inner wall of the reaction tube. However, the present disclosure is not limited to the above embodiment. For example, as illustrated in the sectional structure of the vertical process furnace in FIG. 5A, a buffer chamber is installed on the sidewall of the reaction tube, and the first to third nozzles having the same configuration as the above embodiment may be installed in the buffer chamber in the same arrangement as that of the above embodiment. FIG. 5A shows an example in which a supply buffer chamber and an exhaust buffer chamber are installed on the sidewall of the reaction tube, and are arranged at opposing positions with a wafer interposed therebetween. Each of the supply buffer chamber and the exhaust buffer chamber is installed along the upper portion of the sidewall of the reaction tube from the lower portion thereof, that is, along the wafer arrangement region. Further, FIG. 5A shows an example in which the supply buffer chamber is partitioned into a plurality of (three) spaces and each nozzle is arranged in each space. The arrangement of the three spaces in the buffer chamber is the same as the arrangement of the first to third nozzles. The spaces in which the first to third nozzles are arranged can also be referred to as first to third buffer chambers, respectively. The first nozzle and the first buffer chamber, the second nozzle and the second buffer chamber, and the third nozzle and the third buffer chamber can be considered as a first supplier, a second supplier, and a third supplier, respectively. Further, for example, as illustrated in the sectional structure of the vertical process furnace in FIG. 5B, the buffer chamber may be installed in the same arrangement as that in FIG. 5A, the second nozzle may be installed in the buffer chamber, and the first and third nozzles may be installed along the inner wall of the reaction tube with a communication part of the buffer chamber with the process chamber interposed between both sides. The first nozzle, the second nozzle and the buffer chamber, and the third nozzle can be considered as the first supplier, the second supplier, and the third supplier, respectively. The configuration other than the buffer chamber and the reaction tube described in FIGS. 5A and 5B is the same as the configuration of each part of the process furnace illustrated in FIG. 1. Even when these process furnaces are used, the same film-forming process as that of the above embodiment can be performed, and the same effects as those of the above embodiment can be obtained.

The example in which a film is formed using a batch-type substrate processing apparatus capable of processing a plurality of substrates at a time has been described in the above embodiment. The present disclosure is not limited to the above embodiments, but may be suitably applied, for example, to a case where a film is formed using a single-wafer-type substrate processing apparatus capable of processing a single substrate or several substrates at a time. In addition, the example in which a film is formed using a substrate processing apparatus provided with a hot-wall-type process furnace has been described in the above embodiment. The present disclosure is not limited to the above embodiment, but may be suitably applied to a case where a film is formed using a substrate processing apparatus provided with a cold-wall-type process furnace.

Even in the case of using these substrate processing apparatuses, a film-forming process may be performed according to the same processing procedures and process conditions as those in the above embodiment and modifications, and the same effects as those of the above embodiment and modifications can be achieved.

The above embodiment and modifications may be used in proper combination. The processing procedures and process conditions used in this case may be the same as, for example, the processing procedures and process conditions of the above embodiment.

EXAMPLES

As Example 1, the substrate processing apparatus illustrated in FIG. 1 was used to perform a cycle a predetermined number of times, the cycle non-simultaneously performing the steps 1 and 2 in the above embodiment, to form a SiN film on a bare wafer. When an HCDS gas was supplied from the second supplier in the step 1, the flow rate of the $N_2$ gas supplied from the third supplier was made higher than the flow rate of the $N_2$ gas supplied from the first supplier, and the flow rate of the $N_2$ gas supplied from the first supplier was set to zero. The flow rate of the $N_2$ gas supplied from the third supplier was made lower than the flow rate of the HCDS gas supplied from the second supplier. The other process conditions were predetermined conditions within the process condition range in the above embodiment.

As Example 2, the substrate processing apparatus illustrated in FIG. 1 was used to perform a cycle a predetermined number of times, the cycle non-simultaneously performing the steps 1 and 2 in the above embodiment, to form a SiN film on a bare wafer. When an HCDS gas was supplied from the second supplier in the step 1, the flow rate of the $N_2$ gas supplied from the third supplier was made higher than the flow rate of the $N_2$ gas supplied from the first supplier, and the flow rate of the $N_2$ gas supplied from the first supplier was set to zero. The flow rate of the $N_2$ gas supplied from the third supplier was made higher than the flow rate of the HCDS gas supplied from the second supplier. The other process conditions were the same as the process conditions in Example 1.

As Example 3, the substrate processing apparatus illustrated in FIG. 1 was used to perform a cycle a predetermined number of times, the cycle non-simultaneously performing the steps 1 and 2 in the above embodiment, to form a SiN film on a bare wafer. When an HCDS gas was supplied from the second supplier in the step 1, the flow rate of the $N_2$ gas supplied from the first supplier and the flow rate of the $N_2$ gas supplied from the third supplier were set to be equal to each other. The flow rates of the $N_2$ gases supplied from the first and third suppliers were made lower than the flow rate of the HCDS gas supplied from the second supplier. The other process conditions were the same as the process conditions in Example 1.

As Example 4, the substrate processing apparatus illustrated in FIG. 1 was used to perform a cycle a predetermined number of times, the cycle non-simultaneously performing the steps 1 and 2 in the above embodiment, to form a SiN film on a bare wafer. When an HCDS gas was supplied from the second supplier in the step 1, the flow rate of the $N_2$ gas supplied from the first supplier and the flow rate of the $N_2$ gas supplied from the third supplier were set to be equal to each other. The flow rates of the $N_2$ gases supplied from the first and third suppliers were made higher than the flow rate of the HCDS gas supplied from the second supplier. The other process conditions were the same as the process conditions in Example 1.

Then, the in-plane film thickness distributions of the SiN films of Examples 1 to 4 were measured. FIGS. 6A, 6B, 7A, and 7B show measurement results of the in-plane film thickness distributions of the SiN films of Examples 1 to 4 in order. The horizontal axis of each of these figures indicates the film thickness measurement position, that is, a distance (mm) from the center of the wafer. In addition, the vertical axis of each of these figures indicates the film thickness (Å) of the SiN film at the measurement position.

Figure 6A:
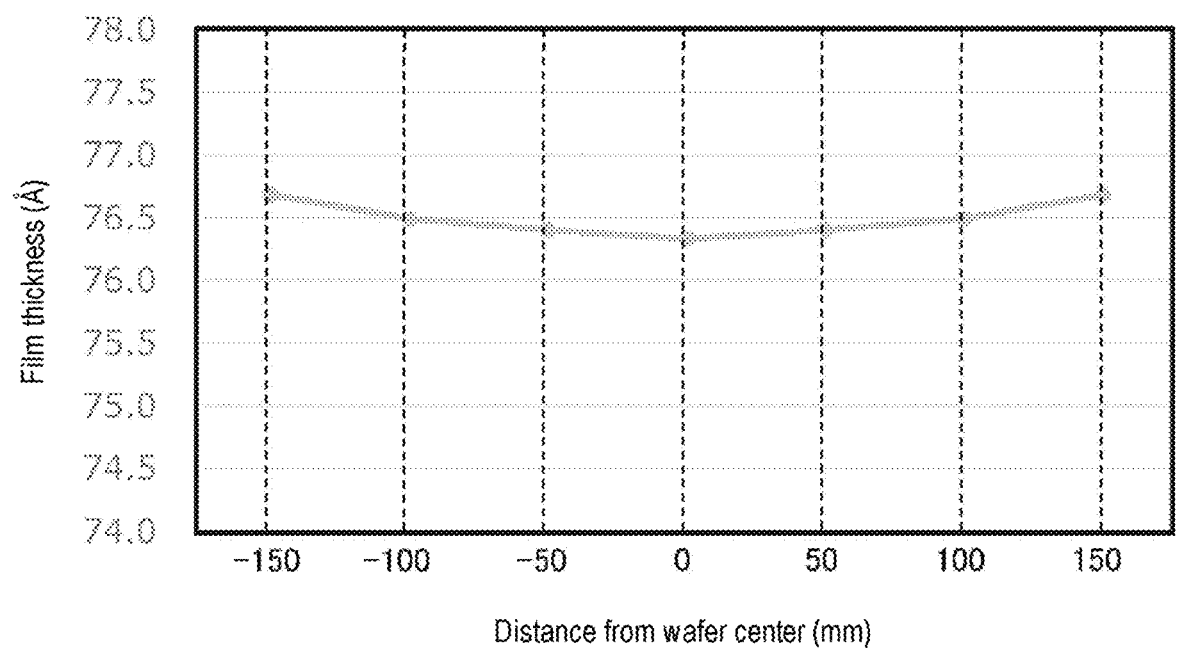
FIGS. 6A and 6B are diagrams showing measurement results of a substrate in-plane film thickness distribution of a film formed on a substrate, respectively.
Figure 6B:
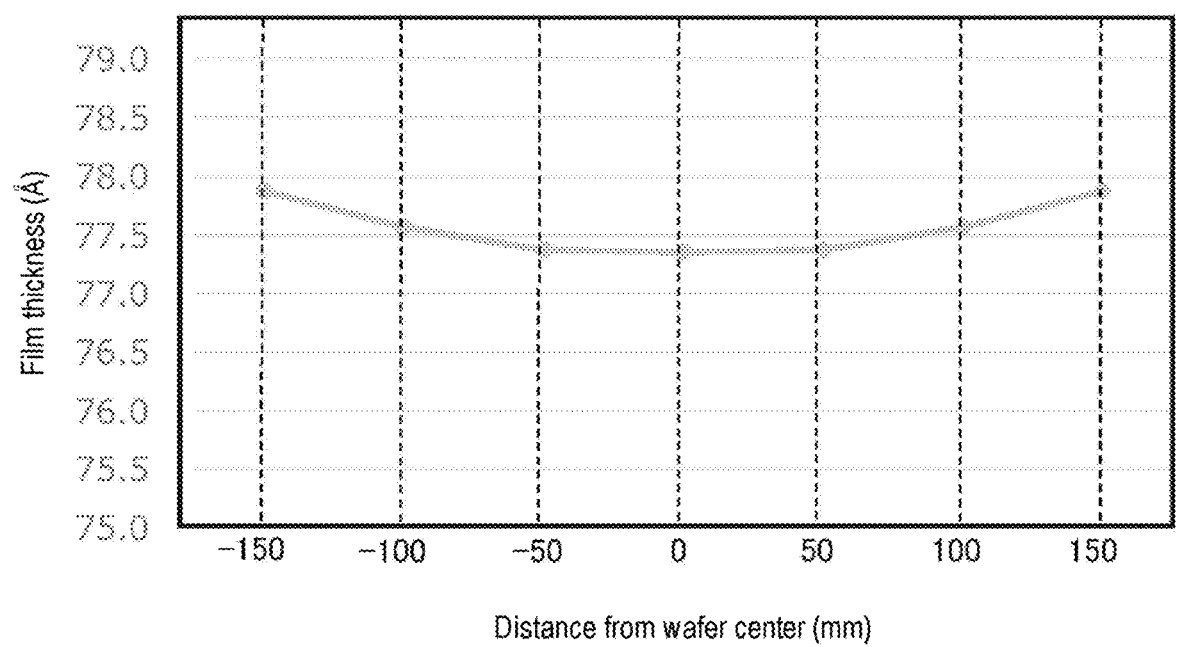
Figure 7A:
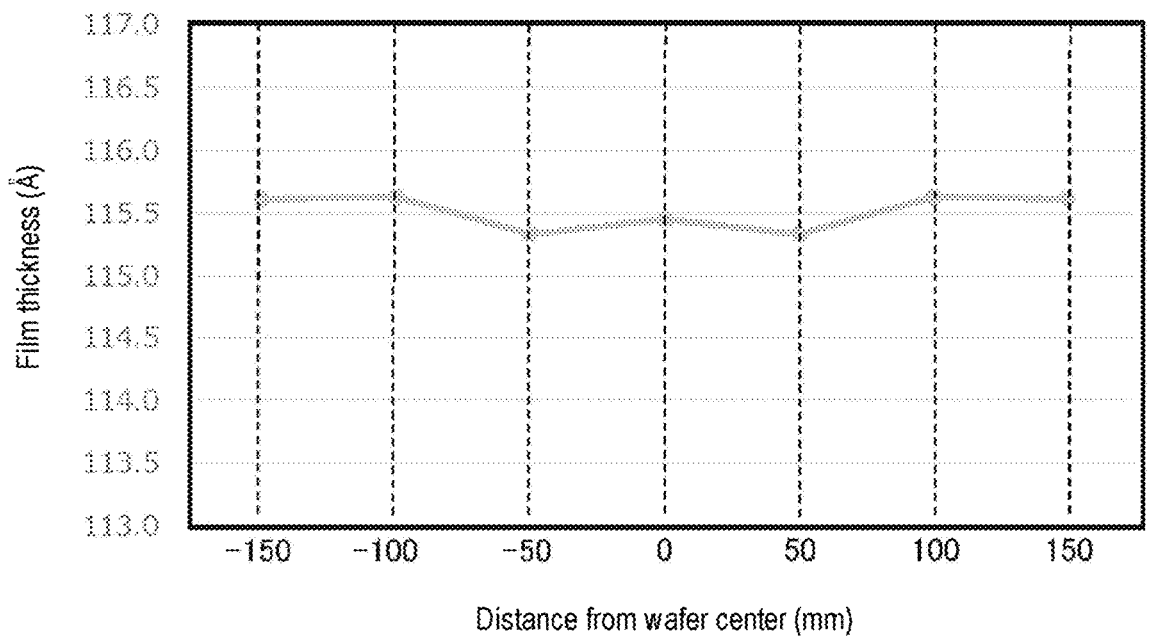
FIGS. 7A and 7B are diagrams showing measurement results of a substrate in-plane film thickness distribution of a film formed on a substrate, respectively.
Figure 7B:
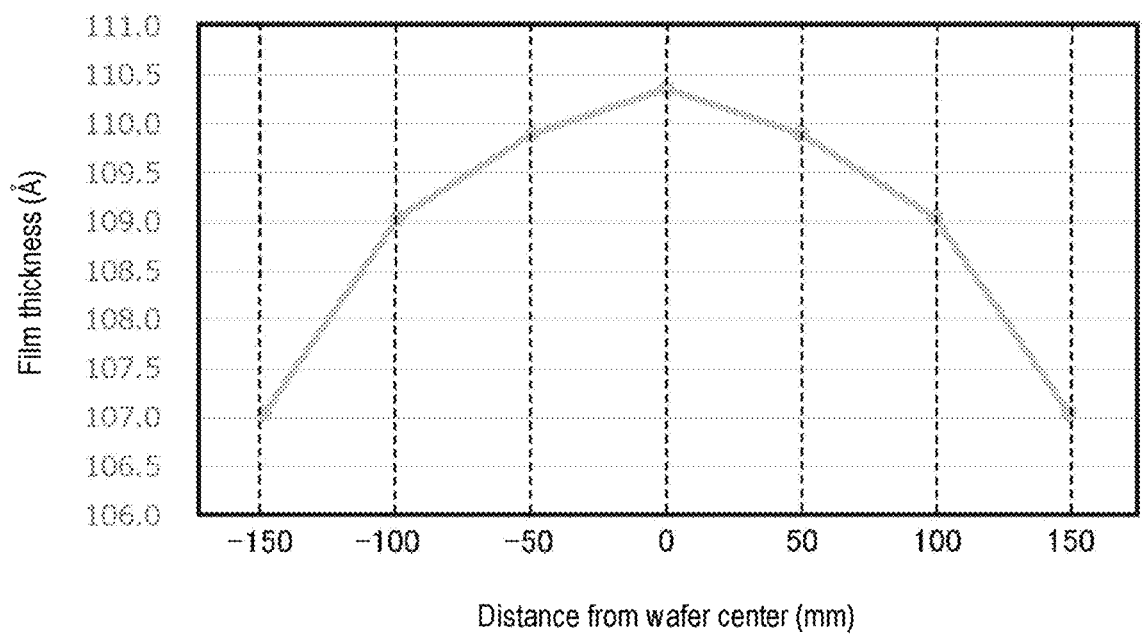

As shown in FIG. 6A, it was confirmed that the in-plane film thickness distribution of the SiN film of Example 1 was a distribution between the central convex distribution and the central concave distribution, which was a weak central concave distribution. In addition, as shown in FIG. 6B, it was confirmed that the in-plane film thickness distribution of the SiN film of Example 2 was a distribution between the central convex distribution and the central concave distribution, which was a central concave distribution stronger than that of Example 1. In addition, as shown in FIG. 7A, it was confirmed that the in-plane film thickness distribution of the SiN film of Example 3 was a weak central concave distribution when viewed in the entire plane, but was a weak central convex distribution in the central portion in the plane. Further, as shown in FIG. 7B, it was confirmed that the in-plane film thickness distribution of the SiN film of Example 4 was a strong central convex distribution.

It has been found from the above results that, when the HCDS gas is supplied from the second supplier in the step 1, the in-plane film thickness distribution of the SiN film formed on the wafer can be adjusted freely by controlling the balance between the flow rate of the $N_2$ gas supplied from the first supplier and the flow rate of the $N_2$ gas supplied from the third supplier.

According to the present disclosure, it is possible to control a substrate in-plane film thickness distribution of a film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A method of manufacturing a semiconductor device, comprising:
   providing a substrate in a process chamber; and
   forming a film on the substrate in the process chamber by supplying an inert gas from a first supplier, supplying a first processing gas from a second supplier, supplying an inert gas from a third supplier and supplying a second processing gas from a fourth supplier to the substrate, wherein the third supplier is installed at an opposite side of the first supplier with respect to a straight line that passes through the second supplier and a center of the substrate, the straight line being interposed between the first supplier and the third supplier, and the first supplier and the third supplier being disposed in line symmetry with the straight line as a symmetry axis, wherein the first supplier, the second supplier and the third supplier are parallel to each other, and wherein in the forming a film, a substrate in-plane film thickness distribution of the film is adjusted by controlling a balance between a flow rate of the inert gas supplied from the first supplier and a flow rate of the inert gas supplied from the third supplier.

2. The method of claim 1, wherein in the forming a film, the flow rate of the inert gas supplied from the first supplier and the flow rate of the inert gas supplied from the third supplier are set to be different from each other.

3. The method of claim 1, wherein in the forming a film, one of the flow rate of the inert gas supplied from the first supplier and the flow rate of the inert gas supplied from the third supplier is set to be higher than the other of the flow rate of the inert gas supplied from the first supplier and the flow rate of the inert gas supplied from the third supplier.

4. The method of claim 3, wherein in the forming a film, the one of the flow rate of the inert gas supplied from the first supplier and the flow rate of the inert gas supplied from the third supplier is set to be higher than a flow rate of the first processing gas.

5. The method of claim 3, wherein in the forming a film, the other of the flow rate of the inert gas supplied from the first supplier and the flow rate of the inert gas supplied from the third supplier is set to be lower than a flow rate of the first processing gas.

6. The method of claim 3, wherein in the forming a film, the one of the flow rate of the inert gas supplied from the first supplier and the flow rate of the inert gas supplied from the third supplier is set to be higher than a flow rate of the first processing gas and the other of the flow rate of the inert gas supplied from the first supplier and the flow rate of the inert gas supplied from the third supplier is set to be lower than the flow rate of the first processing gas.

7. The method of claim 3, wherein in the forming a film, the one of the flow rate of the inert gas supplied from the first supplier and the flow rate of the inert gas supplied from the third supplier is set to be higher than a flow rate of the first processing gas and the other of the flow rate of the inert gas supplied from the first supplier and the flow rate of the inert gas supplied from the third supplier is set to zero.

8. The method of claim 3, wherein in the forming a film, the other of the flow rate of the inert gas supplied from the first supplier and the flow rate of the inert gas supplied from the third supplier is set to zero.

9. The method of claim 1, wherein in the forming a film, a condition, in which the substrate in-plane film thickness distribution of the film becomes a central convex distribution when the film is formed on a bare substrate, is established by setting the flow rate of the inert gas supplied from the first supplier to be equal to the flow rate of the inert gas supplied from the third supplier, and a condition, in which the substrate in-plane film thickness distribution of the film becomes any distribution between a central convex distribution and a central concave distribution when the film is formed on a bare substrate, is established by setting the flow rate of the inert gas supplied from the first supplier to be different from the flow rate of the inert gas supplied from the third supplier.

10. The method of claim 9, wherein, when the flow rate of the inert gas supplied from the first supplier and the flow rate of the inert gas supplied from the third supplier are set to be equal to each other, the respective flow rates are set to be higher than a flow rate of the first processing gas.

11. The method of claim 9, wherein, when the flow rate of the inert gas supplied from the first supplier and the flow rate of the inert gas supplied from the third supplier are set to be different from each other, one of the flow rate of the inert gas supplied from the first supplier and the flow rate of the inert gas supplied from the third supplier is set to be higher than the other of the flow rate of the inert gas supplied from the first supplier and the flow rate of the inert gas supplied from the third supplier, and the one of the flow rate of the inert gas supplied from the first supplier and the flow rate of the inert gas supplied from the third supplier is set to be higher than a flow rate of the first processing gas.

12. The method of claim 9, wherein, when the flow rate of the inert gas supplied from the first supplier and the flow rate of the inert gas supplied from the third supplier are set to be different from each other, one of the flow rate of the inert gas supplied from the first supplier and the flow rate of the inert gas supplied from the third supplier is set to be higher than the other of the flow rate of the inert gas supplied from the first supplier and the flow rate of the inert gas supplied from the third supplier, and the other of the flow rate of the inert gas supplied from the first supplier and the flow rate of the inert gas supplied from the third supplier is set to be lower than a flow rate of the first processing gas.

13. The method of claim 9, wherein, when the flow rate of the inert gas supplied from the first supplier and the flow rate of the inert gas supplied from the third supplier are set to be different from each other, one of the flow rate of the inert gas supplied from the first supplier and the flow rate of the inert gas supplied from the third supplier is set to be higher than the other of the flow rate of the inert gas supplied from the first supplier and the flow rate of the inert gas supplied from the third supplier, the one of the flow rate of the inert gas supplied from the first supplier and the flow rate of the inert gas supplied from the third supplier is set to be higher than a flow rate of the first processing gas, and the other of the flow rate of the inert gas supplied from the first supplier and the flow rate of the inert gas supplied from the third supplier is set to be lower than the flow rate of the first processing gas.

14. The method of claim 9, wherein, when the flow rate of the inert gas supplied from the first supplier and the flow rate of the inert gas supplied from the third supplier are set to be different from each other, one of the flow rate of the inert gas supplied from the first supplier and the flow rate of the inert gas supplied from the third supplier is set to be higher than the other of the flow rate of the inert gas supplied from the first supplier and the flow rate of the inert gas supplied from the third supplier, the one of the flow rate of the inert gas supplied from the first supplier and the flow rate of the inert gas supplied from the third supplier is set to be higher than a flow rate of the first processing gas, and the other of the flow rate of the inert gas supplied from the first supplier and the flow rate of the inert gas supplied from the third supplier is set to zero.

15. The method of claim 9, wherein, when the flow rate of the inert gas supplied from the first supplier and the flow rate of the inert gas supplied from the third supplier are set to be different from each other, one of the flow rate of the inert gas supplied from the first supplier and the flow rate of the inert gas supplied from the third supplier is set to be higher than the other of the flow rate of the inert gas supplied from the first supplier and the flow rate of the inert gas supplied from the third supplier, and the other of the flow rate of the inert gas supplied from the first supplier and the flow rate of the inert gas supplied from the third supplier is set to zero.

16. The method of claim 1, wherein in the forming a film, the second processing gas having a molecular structure different from a molecular structure of the first processing gas is supplied to the substrate in the process chamber.

17. The method of claim 16, wherein in the forming a film, a cycle is performed a predetermined number of times, the cycle including non-simultaneously performing:
   supplying the inert gas from the first supplier, supplying the first processing gas from the second supplier, and supplying the inert gas from the third supplier to the substrate in the process chamber; and
   supplying the second processing gas to the substrate in the process chamber.

18. The method of claim 17, wherein in the supplying the second processing gas, the second processing gas is supplied from at least one selected from a group of the first supplier and the third supplier.

19. A substrate processing apparatus comprising:
   a process chamber in which a substrate is processed;
   a first supply system configured to supply an inert gas from a first supplier to the substrate in the process chamber;
   a second supply system configured to supply a first processing gas from a second supplier to the substrate in the process chamber;
   a third supply system that is configured to supply an inert gas from a third supplier to the substrate in the process chamber;
   a fourth supply system that is configured to supply a second processing gas from a fourth supplier to the substrate in the process chamber, wherein the third supplier is installed at an opposite side of the first supplier with respect to a straight line that passes through the second supplier and a center of the substrate in the process chamber, the straight line being interposed between the first supplier and the third supplier, and the first supplier and the third supplier being disposed in line symmetry with the straight line as a symmetry axis, wherein the first supplier, the second supplier and the third supplier are parallel to each other; and
   a controller configured to be capable of controlling the first supply system, the second supply system, and the third supply system so as to perform a process of forming a film on the substrate by supplying the inert gas from the first supplier, supplying the first processing gas from the second supplier, and supplying the inert gas from the third supplier to the substrate provided in the process chamber, wherein in the forming a film, a substrate in-plane film thickness distribution of the film is adjusted by controlling a balance between a flow rate of the inert gas supplied from the first supplier and a flow rate of the inert gas supplied from the third supplier.

20. A non-transitory computer-readable recording medium storing a program that causes, by a computer, a substrate processing apparatus to perform a process comprising:
   providing a substrate in a process chamber; and
   forming a film on the substrate in the process chamber by supplying an inert gas from a first supplier, supplying a first processing gas from a second supplier, supplying an inert gas from a third supplier to the substrate, and supplying a second processing gas from a fourth supplier to the substrate,
   wherein the third supplier is installed at an opposite side of the first supplier with respect to a straight line that passes through the second supplier and a center of the substrate, the straight line being-interposed between the first supplier and the third supplier, and the first supplier and the third supplier being disposed in line symmetry with the straight line as a symmetry axis, wherein the first supplier, the second supplier and the third supplier are parallel to each other, and
   wherein in the forming a film, a substrate in-plane film thickness distribution of the film is adjusted by controlling a balance between a flow rate of the inert gas supplied from the first supplier and a flow rate of the inert gas supplied from the third supplier.

* * * * *